United States Patent [19]

Lee et al.

[11] Patent Number: 5,401,675
[45] Date of Patent: Mar. 28, 1995

[54] METHOD OF DEPOSITING CONDUCTORS IN HIGH ASPECT RATIO APERTURES USING A COLLIMATOR

[76] Inventors: Pei-Ing P. Lee, 32 Stirrup Cir., Williston, Vt. 05495; Thomas J. Licata, 161 Austin Dr. #1, Burlington, Vt. 05401; Thomas L. McDevitt, R.R. #2, Box 3230, Underhill, Vt. 05489; Paul C. Parries, 32 Tanglewood Dr., Wappingers Falls, N.Y. 12590; Scott L. Pennington, 26 Knoll Cir., South Burlington, Vt. 05403; James G. Ryan, 97 Brigham Hill Rd., Essex Junction, Vt. 05452; David C. Strippe, R.R. 1 Box 8460, Waterbury Center, Vt. 05677

[21] Appl. No.: 36,224

[22] Filed: Mar. 24, 1993

Related U.S. Application Data

[63] Continuation of Ser. No. 690,171, Apr. 19, 1991, abandoned.

[51] Int. Cl.$^6$ .......................................... H01L 21/441
[52] U.S. Cl. .................................. 437/192; 437/195; 437/203
[58] Field of Search .................. 437/192, 195, 203; 148/DIG. 158; 427/97; 204/192, 12, 17, 298

[56] References Cited

U.S. PATENT DOCUMENTS

| | | | |
|---|---|---|---|
| 4,116,791 | 9/1978 | Zega | 204/192.3 |
| 4,226,082 | 10/1980 | Nishida | 204/192.3 |
| 4,724,060 | 2/1988 | Sakata et al. | 204/298 |
| 4,725,566 | 2/1988 | Pham et al. | 437/180 |
| 4,756,810 | 7/1988 | Lamont, Jr. et al. | 204/192.3 |
| 4,783,248 | 11/1988 | Kohlhase et al. | 204/912.17 |
| 4,822,753 | 4/1989 | Pintchovski et al. | 437/192 |
| 4,824,544 | 4/1989 | Mikaliesen et al. | 204/298 |
| 4,849,079 | 7/1989 | Cuomo et al. | 204/192.17 |
| 4,897,709 | 1/1990 | Yokoyama et al. | 437/197 |
| 4,920,073 | 4/1990 | Wei et al. | 437/200 |
| 4,962,414 | 8/1990 | Liou et al. | 437/246 |
| 4,994,162 | 2/1991 | Armstrong et al. | 204/192.15 |
| 5,008,217 | 4/1991 | Case et al. | 437/194 |
| 5,026,470 | 6/1991 | Bonyhard et al. | 204/298.16 |
| 5,112,693 | 5/1992 | Gilliery | 428/432 |

FOREIGN PATENT DOCUMENTS

| | | |
|---|---|---|
| 044372 | 1/1982 | European Pat. Off. |
| 62-17173 | 1/1987 | Japan |
| 62-199033 | 9/1987 | Japan |
| 63-310965 | 12/1988 | Japan |

OTHER PUBLICATIONS

"High Aspect Ratio Hole Filling by Tungsten Chemical Vapor Deposition Combined with a Silicon Sidewall and Barrier Metal for Multilevel Interconnection," K. Suguro et al., *J. Appl. Phys.*, 62(4), 15 Aug. 1987, pp. 1265–1273.

*Thin Films Processes*, J. L. Vossen et al. (Ed.), Academic Press, 1978, pp. 32–39.

"Collimated Magnetron Sputter Deposition," S. M. Rossnagel et al. J. Vac. Sci. Technology A, vol. 9, No. 2. Apr. 1991, pp. 261–265.

Abstract of presentation by Stephen M. Rossnagel on Oct. 27, 1989 at the American Vacuum Society Conference.

*Primary Examiner*—Olik Chaudhuri
*Assistant Examiner*—David E. Graybill
*Attorney, Agent, or Firm*—Mark F. Chadurjian; William P. Skladony; Philip E. Hansen

[57] ABSTRACT

A process for sputter deposition wherein high aspect ratio apertures are coated with conductive films exhibiting low bulk resistivity, low impurity concentrations, and regular morphologies. A collimator is used having an aspect ratio that approximates the aspect ratio of the apertures.

12 Claims, 4 Drawing Sheets

| WAFER SAMPLE | GRAIN SIZE (NM) | FILM THICKNESS (NM) | BULK RESISTIVITY (uOHM-CM) |
|---|---|---|---|
| 200 mm, 150.,Ar/n2 CENTER | 6-15 | 61 | 866 |
| 200 mm, 150C.,Ar/N2 EDGE | 4-10 | 62 | 306 |
| 200 mm, 150C.,N2 ONLY CENTER | 7-17 | 66 | 1180 |
| 200 mm, 150C.,N2 ONLY EDGE | 6-10 | 73 | 305 |
| 125 mm, 150C.,N2 ONLY CENTER COLLIMATED | <10 | 59 | 124 |
| 125 mm, 150C.,N2 ONLY EDGE COLLIMATED | <10 | 61 | 102 |
| 200 mm, 500C.,Ar/N2 CENTER | 5-16 | 58 | 560 |
| 200 mm, 500C.,Ar/N2 EDGE | 4-12 | 64 | 205 |
| 200 mm, 500.,N2 ONLY CENTER | 6-15 | 63 | 640 |
| 200 mm, 500C.,N2 ONLY EDGE | 5-15 | 75 | 190 |
| 125 mm, 450C.,N2 ONLY CENTER, COLLIMATED | <10 | 60 | 90 |

FIG. 2

METHOD OF DEPOSITING CONDUCTORS IN HIGH ASPECT RATIO APERTURES USING A COLLIMATOR

This is a continuation of application Ser. No. 07/690,171, filed on Apr. 19, 1991, now abandoned.

BACKGROUND OF THE INVENTION

1. Technical Field

The invention relates generally to the interconnection of integrated circuit structures, and more particularly to the formation of conductors within high aspect ratio apertures.

2. Background Art

As integrated circuit structures have become more compact, the need for low resistance metal connections between these structures has increased. Chemically vapor deposited (CVD) tungsten, evaporated aluminum doped with copper or silicon, and titanium or cobalt silicide have been used recently in tne industry to provide tnese interconnections.

It has been found that, in order to preserve the low resistivity of these metals, it is necessary to include some sort of barrier layer between the metal and the conductive structure to be contacted. These barrier layers prevent spiking between the metal and underlaying structures, while also preventing diffusion of nonconductive species that may penetrate into underlaying structures during the deposition of the metal. For example, during the deposition of CVD tungsten, fluorine byproducts of the chemical reduction of tungsten hexafluoride may penetrate lower layers and degrade resistivity characteristics. Moreover, when the underlaying structures include nonreactive insulators such as silicon oxide, barrier layers provide enhanced adhesion between the metal and the insulator. Finally, some barrier layers such as titanium help reduce Interfacial resistance by reacting with, and removing, native oxides and etch residuals from exposed interfaces.

One of the layers that has been used recently in the art is titanium nitride (TiN). Typically, the TiN barrier layer is formed by reactive sputtering from a titanium source in a nitrogen-containing ambient or directly from a titanium nitride source. Examples include U.S. Pat. No. 4,783,248, "Method For The Production Of A Titanium/Titanium Nitride Double Layer," to Kohlhase et al. and assigned to Siemens; U.S. Pat. No. 4,822,753, "Method For Making A W/TiN Contact," to Pintchovski et al. and assigned to Motorola; and U.S. Pat. No. 4,920,073, "Selective Silicidation Process Using A Titanium Nitride Protective Layer," to Wei et al. and assigned to Texas Instruments.

Conventional sputtering provides satisfactory results when used on a planar surface. Moreover, it also is useful when used to coat the sidewalks and bottom of an aperture (or via) formed through a passivation or other insulating layer to an underlaying structure, where the ratio of the height of the aperture to its width (hereinafter the "aspect ratio" of the via) is less than 1:1. However, as the aspect ratio of the via increases, conventional sputtering does not provide acceptable results. Specifically, far less material is deposited at the Dottom portions of the via or hole than at the top, since the walls "shadow" the lower exposed surface. As a result, deposited material at the upper surfaces increasingly accentuates the shadowing effect, thereDy prematurely closing the upper section of the structure to be filled and preventing effective fill of the lower section.

This problem is illustrated in FIG. 5 of U.S. Pat. No. 4,897,709, "Titanium Nitride Film In Contact Hole With Large Aspect Ratio," to Yokoyama et al. and assigned to Hitachi. The sputtered titanium nitride is 135 nm thick on the upper surface of the passivation layer and only 40 nm thick at the bottom of the contact. Also, note that portions of the titanium nitride on the upper surface of the passivation layer extend into the contact hole to form rounded deposits on the upper sidewalls of the contact hole. This deposit will tend to close of the contact hole before it is completely filled by either sputtered or CVD deposited conductor films.

The solution disclosed by Yokoyama et al. is to deposit the titanium nitride in a plasma CVD reaction. By its very nature, CVD tends to be more conformal, such that the amount of material at the bottom of the contact hole will be similar to the amount on the upper norizontal surfaces. This will also prevent the formation of the aforementioned rounded deposits. Unfortunately, the deposition is carried out using chlorinated titanium species such as titanium tetrachloride. During the titanium reduction reaction, chlorinated reaction products may be incorporated into the titanium nitride, substantially reducing the low contact resistance benefits afforded by titanium nitride. Further, the omission of a pure Ti layer from the structure means that native oxides or other nonconductive residuals will not be removed from the bottom of the contact hole.

SUMMARY OF THE INVENTION

It is thus an object of the present invention to form a layer(s) of conductive material within high aspect ratio apertures.

It is another object of the invention to provide a barrier layer material(s) that provide high conductivity, low impurity concentrations, high gettering properties, and regular surface morphology, without introducing reactive products that may substantially degrade these properties.

It is yet another object of the invention to form such a barrier layer material by a process that enhances the amount of material at the bottom of a high aspect ratio aperture without introducing reactive byproducts that may substantially degrade contact resistance and other properties of the deposited material or of underlying layers or structures.

The above and other objects of the present invention are realized by depositing conductive materials by sputtering through a collimator. The collimator enhances the amount of material deposited at the bottom of the aperture relative to the amount on the upper surface of the insulator. Moreover, the resulting material provides good resistivity and other properties without introducing reaction products that could degrade these properties.

BRIEF DESCRIPTION OF THE DRAWING

The foregoing and other structures and teachings of the present invention will become more apparent upon review of the description of the best mode for carrying out the invention as rendered below. In the description to follow, reference will be made to the accompanying Drawing, in which:

FIG. 2 is a table of the bulk resistivities of layers of titanium nitride formed in accordance with the teachings of the invention;

DESCRIPTION OF THE BEST MODE FOR CARRYING OUT THE INVENTION

Figure 1:
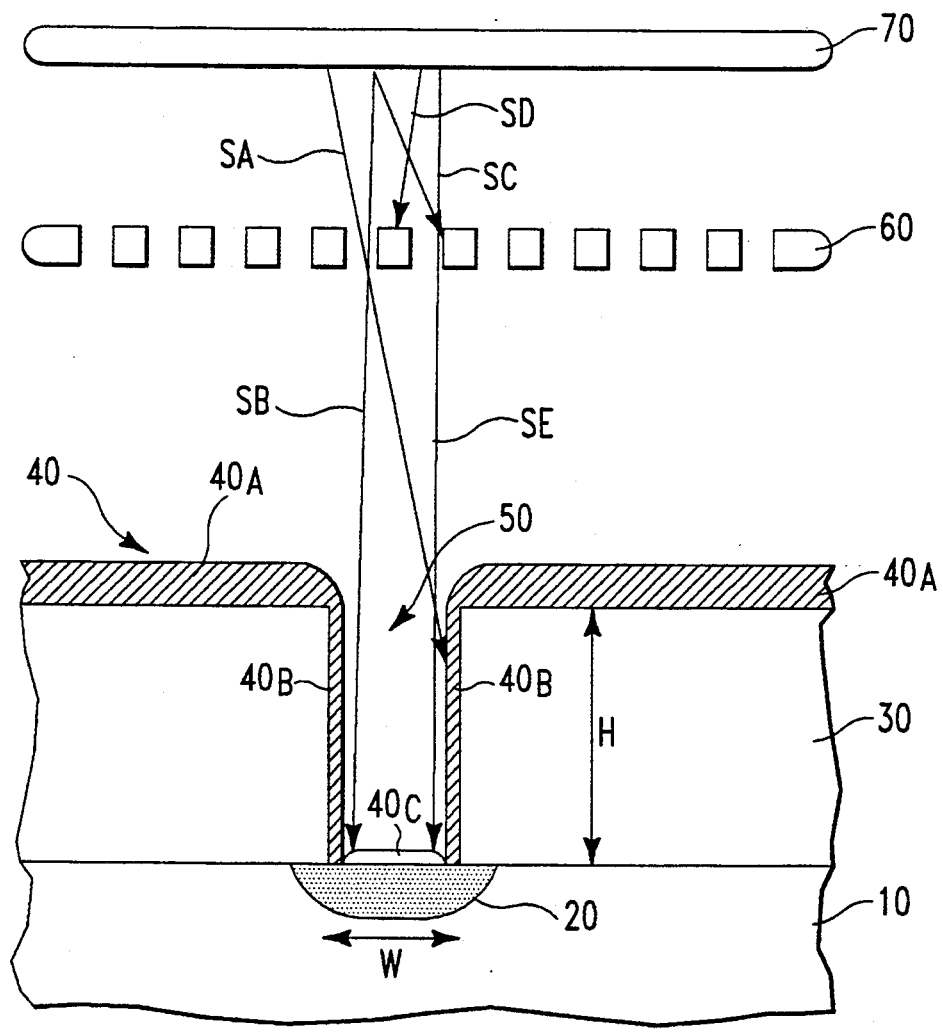
FIG. 1 is a cross-sectional view of an integrated circuit having the conductive material of the invention formed thereon, by deposition through a collimator.

With reference to FIG. 1, a substrate 10 is shown having a diffusion region 20 formed thereon, wherein the conductor of the invention 40 is deposited through an aperture 50 in passivation 30. Passivation layer 30 of borophosphosilicate glass (BPSG) or phosphosilicate glass (PSG) is deposited at thickness H of approximately 11K angstroms. A contact hole 50 is formed through the BPSG or PSG 30 to expose the diffusion region 20. The width W of the contact hole 50 is approximately 5000 angstroms, such that the aspect ratio H:W of the diffusion contact is on the order of 2:1.

In the invention, layer 40 is formed by reactive sputtering from a sputter target 70 through a collimator 60. The collimator 60 is disposed on a plane normal to the plane of the contact holes. Preferably, it is also parallel to the sputter target 70. The collimator 60 consists of a series of adjacent apertures formed in a 1 cm thick plate of steel or other material that will not melt or deform under the sputtering conditions discussed below. The apertures are arranged in a honeycomb pattern. An example of the use of a collimator to deposit sputtered material (copper) is given in a presentation by S. M. Rossnagel et al., "Lift-Oft Magnetron Sputter Deposition," American Vacuum Society 36th National Symposium, Boston Mass., Oct. 23–27 1989, Final Program p. 286 (copper deposited on lift-off structures to eliminate sidewall depositions); see also Rossnagel's U.S. Pat. No. 4,824,544.

The effect of the collimator is to restrict the paths of sputtered species to near-normal angles of incidence at the substrate surface. Species at other tnan near-normal angles oeposit at the collimator surface, or within the collimator apertures. This is shown by lines SA–SE in the FIG. 1, which represent the sputter patns of atoms from target 50. Notice that sputter atoms with paths SA, SB, and SE pass through the collimator apertures and are deposited on the substrate. Atoms along paths SC and SD, which vary off a non-normal angle of incidence, are not passed through the collimator.

In general, the result of sputtering though the collimator is to form a Layer 40 in which the thickness of the portions 40C at the bottom of the contact hole is a higher percentage of the thickness of portions 40A on the upper surface of the passivation layer than would have been obtained without a collimator. Also, as will be discussed in more detail below, the resulting films exhibit morphology, contact resistance, and other properties that are superior in some respects to properties achieved using conventional sputtering. Finally, note that the material 40B deposited on the sidewalls of the contact hole is of fairly uniform thickness; there is no buildup on upper portions of the contact hole sidewalls as there would be if deposited using conventional sputtering techniques.

The results of various experiments carried out using sputtered titanium, titanium nitride, and a sputtered Ti/TiN bilayer stack will now be discussed below.

1. Sputtered Titanium Nitride

In one group of experiments, a blanket layer of titanium nitride was deposited on silicon dioxide at 150° C. in an N2 ambient by sputtering, where the only variable was the use of a collimator. Profiles of oxygen concentration in the films in deptn were measured using electron spectroscopy for chemical analysis (ESCA). The TiN sputtered through a collimator had a surface oxygen content of approximately 30%. This was due to initial adsorption of ambient oxygen upon removal of the sample from the deposition unit. This oxygen percentage dropped to under 1% within the first 1/10 of the TiN thickness, and remained there throughout the rest of the film. For TiN layers sputtered without a collimator, the oxygen content started out at the same 30%, but it declined to approximately 6–8% within the same 1/10 thickness that the TiN through the collimator dropped to under 1%. Moreover, the TiN without collimated sputtering had on the order of 3–6% oxygen content throughout. These results indicate that the film deposited using collimation is more dense and less porous to post deposition oxygen contamination than is the film deposited without collimation. Note that low oxygen content is important since it minimizes the formation of Ti Oxide, which degrades the electrical resistivity and adhesive properties of the film.

This improvement was confirmed in another series of experiments in which bulk resistivities of the collimated versus non-collimated deposits were measured. FIG. 2 presents a table snowing the results for a layer of TiN of given thickness formed on a 125 or 200 mm diameter silicon water, at the stated deposition temperature and ambient (equal amounts argon and nitrogen indicated as "Ar/N2," and alternatively a pure nitrogen ambient indicated as "N2"). The words "center" and "edge" refer to the vicinity of the wafer (the center versus the edge) from which readings were taken. Whether the wafers are 125 vs 200 mm does not have a bearing on the results. The results indicate that all else being equal, collimation reduces bulk resistivity Dy at least 3 times (102 ohms-cm versus 30b for depositions at 120° C. in N2 with measurements taken at the wafer edge; 124 versus 1180 (almost 10× less) with measurements taken at the wafer center; and 90 versus 640 (6× less) for approximately 500° C. in N2 only, with measurements from the wafer center). This large reduction in bulk resistivity was greater than could be reasonably accounted for by less oxygen content and is attributed to a more dense microstructure of the film (i.e., fewer nonconducting voids).

In another group of experiments, TiN was deposited by sputtering techniques, again with collimation being the only variable, and the films were cleaved and analyzed from SEM micrographs. It was found that in general, the collimated TiN exhibits a very dense morphology, in the sense of less intergranular voiding than is present in sputtered TiN without collimation. Moreover, the film had a highly columnar grain structure. This more dense morphology may play an important role in the reduced bulk resistance noted above; moreover, the reduced intergranular voids may reduce oxygen penetration in the film and provide a more impervious barrier to penetration by reactive by-products of the CVD process.

2. Sputtered Titanium

Similar results were achieved for titanium deposited using the collimator. That is, collimated titanium tended to exhibit lower oxygen impurity concentrations, lower bulk resistivity, and more regular morphology.

Figure 3:
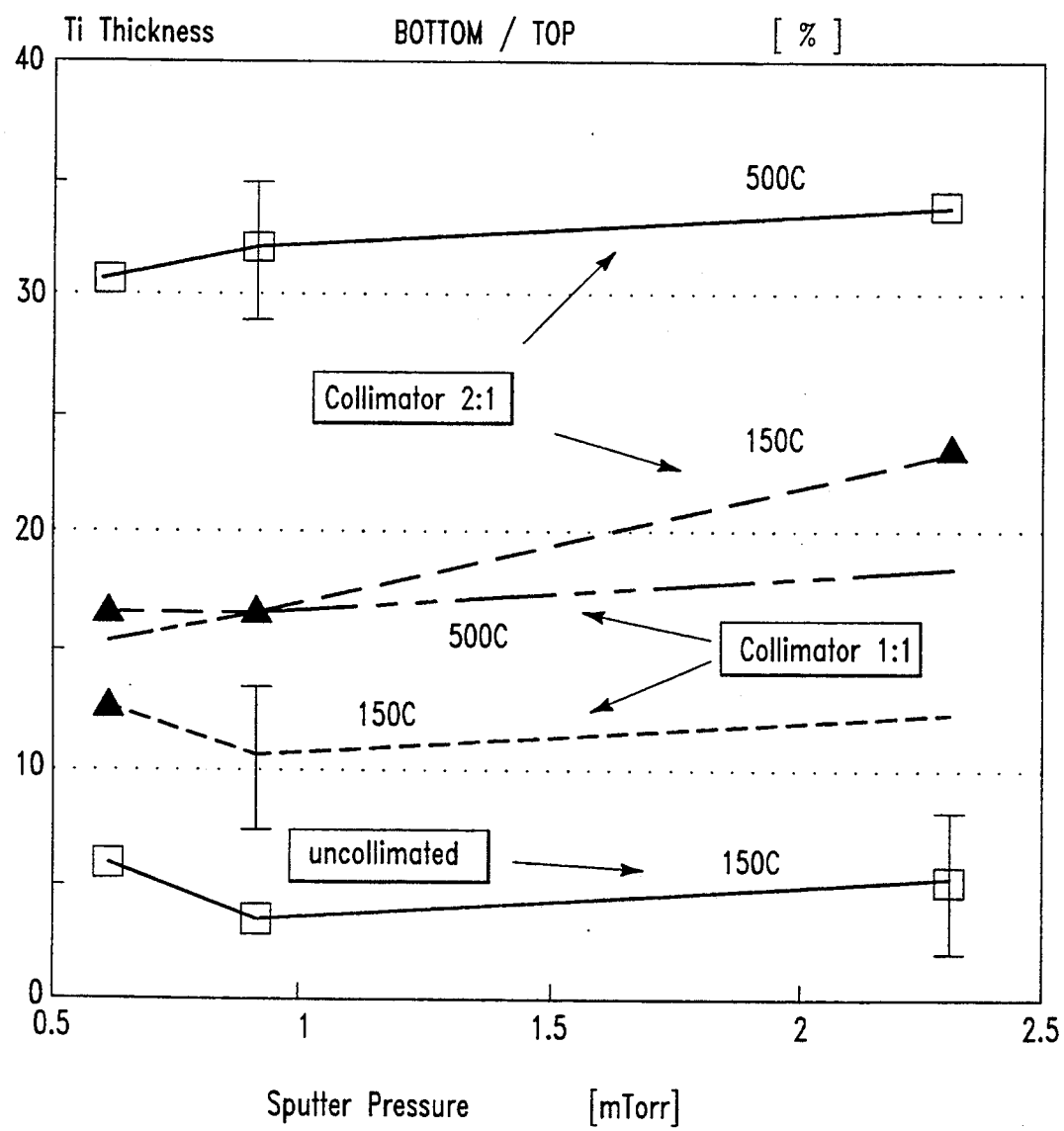
FIG. 3 is a graph of titanium thickness at the bottom of a high aspect ratio via versus sputter pressure in accordance with the teachings of the invention.

Additional studies illustrate the increase in the amount of material at the bottom of the contact hole. FIG. 3 is a plot of the thickness of titanium at the bottom of a contact hole having an aspect ratio of approximately 2:1, as a percentage of the thickness of titanium at the upper surface of the passivation layer, against sputter pressure. Note that the thickness of the uncollimated film at the bottom of the contact hole is only approximately 5% of the thickness of the layer at the upper surface of the passivation layer, over the entire range of sputter pressures studied.

Note that the thickness ratio increases as a collimator is used; as the deposition temperature is raised; and as the aspect ratio of the collimator is increased. The temperature at which titanium deposition is carried out plays a great role in film thickness at the bottom. At a collimator aspect ratio of 1:1, raising the deposition temperature above 150° C. to 500° C. increases the fractional deposit by 7%. At a collimator aspect ratio of 2:1, increasing the temperature from 150° to 500° C. doubles the film thickness at low pressures, and increases the percentage by 10% at higher sputter pressures. This phenomenon was not observed for titanium sputtered without a collimator; increasing the temperature did not increase the film thickness at the bottom of the contact hole by more than a few percent. Also, this phenomenon was not observed for uncollimated titanium nitride; again, carrying out TiN deposition at higher temperatures did not increase film thickness at the bottom of the contact hole by more than a few percent.

There is a direct relationship Detween increasing the aspect ratio of the collimator and increasing the fraction of deposited material at the bottom of the contact holes with respect to the top. Omitting the variations due to temperature that is, considering only the 150° C. depositions shown in FIG. 3), and considering the data at a sputter pressure of 0.9 mTorr, note that the percentage is around 4% for the uncollimated case, 11% for the collimator at a 1:1 aspect ratio, and 17% for the collimator at a 2:1 aspect ratio, which is four times greater than the non-collimated case. Similar results are expected for titanium nitride since the sputtered titanium behaves similarly in N2 or N2/AR ambient.

Figure 4:
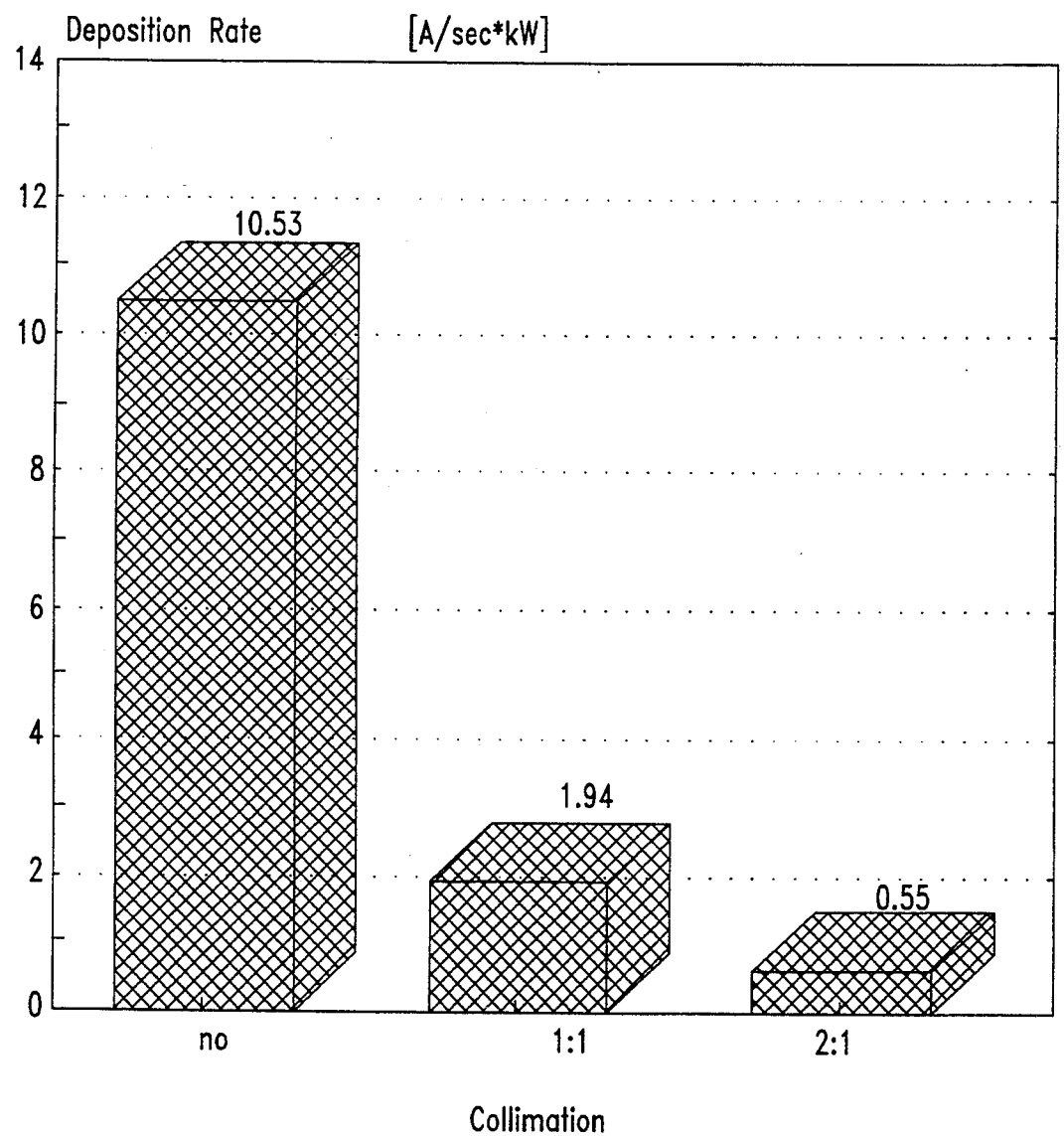
FIG. 4 is a bar chart of titanium deposition rate as a function of collimation aspect ratio.

The inventors nave found that this increase in aspect ratio decreases the amount of material deposited in unit time by roughly the same 4× factor. As shown in FIG. 4, the deposition rate decreases markedly when a 1:1 collimator is used, and decreases by a factor of four from a 1:1 collimator to a 2:1 collimator. With reference to FIG. 1, as the aspect ratio of the collimator increases, the percentage of sputter atoms that follow a path SC will increase, such that less atoms are available for deposit. At the same time, the atoms that do make it through the collimator will be on a lower angie of incidence relative to the plane of the contact hole. In other words, the percentage of atoms following paths such as SB, SE will increase, thus increasing the percentage of atoms that make it to the bottom of the contact hole.

The inventors also found that the increased fractional deposit did not follow for contact holes having lower aspect ratios. A 2:1 collimator did not provide enhanced results over the results achieved using a 1:1 collimator for low aspect ratio features. Thus, the inventors postulate that the optimal tradeoff between deposition rates and increased deposit at the bottom of the contact hole is provided where the aspect ratio of the collimator apertures is no greater than the aspect ratio of the contact holes.

Increased Ti at the bottom of nigh aspect ratio apertures has also been found to reduce the resistance of TiSi2 silicided electrodes. A collimated deposit (aspect ratio of 1.5:1) of titanium in a 0.8 um deep aperture greatly reduced ultimate silicide resistance is compared to the non-collimated case. The resistance decrease/-stabilization increased with the aspect ratio of the aperture.

3. Sputtered Ti/TiN Bilayer

The results discussed above for Ti and TIN singularly appear to provide a synergistic effect in combination. Experiments were carried out in which 600 angstroms of Ti and 400 angstroms of TiN were successively sputtered through contact holes having 2:1 aspect ratios and greater, to contact separate n and p diffusion regions. The contact hole was then filled with blanket CVD tungsten, tungsten studs were formed by standard planarization processes and the filled contacts were interconnected by an aluminum wiring level. For non-collimated Ti/TiN, the mean contact resistance was 71 ohms/contact for the N+ contact, and 138 ohms/contact for the P+ contact. For collimated Ti/TIN, the contact resistance was approximately 1 ohm/contact for both N+ and P+ contacts. Again, sputtering through a collimator greatly reduces contact resistance when compared to non-collimated depositions. We attribute this reduction in contact resistance to a reaction of the additional titanium deposited at the bottom os the contact. In addition, the more dense nature of the collimated TiN barrier film prevents fluorine penetration under and into titanium during the CVD tungsten deposition process.

Having discussed the various experimental results achieved using collimated sputtering, we will now discuss the specifics os the sputtering process itself. The general process is similar to conventional sputtering methods. A gaseous plasma of an inert atom such as Argon is created that bombards the cathode target, dislodging atoms that are deposited on the electrically decoupled substrate. In the case of titanium nitride, better process control is achieved by eliminating argon from the system, and using N2 gas as both the bombardment source and the recombinant specie that reacts with the titanium atoms to form a titanium nitride deposit.

Plasma (working) gas atoms (e.g. Ar) scatter sputtered atoms, potentially knocking them "off-line" after the sputtered atoms pass through the collimator. Therefore, it is important that low working gas pressures (less than 1.0 mtorr) are used when depositing through a collimator in order to lessen scattering. Working gas composition also affects scattering. Argon atoms tend to cause greater deflection of sputtered atoms than would a lighter working gas such as nitrogen. Pure nitrogen is the preferred working gas to deposit TiN using a collimator. The use of pure nitrogen assures that, even at the low pressures required with collimation, sufficient nitrogen is present to form TiN. The tradeoff here is that the lighter N2 atoms are not as efficient in dislodging titanium atoms from the sputter source, such that the cathode power has to be increased from 3–6 kW for the usual argon ambient to 6–9 kW of the N2 ambient.

These experiences with TiN deposition lead to several conclusions as to how to minimize gas scattering. One conclusion is to use lighter inert atoms even wnen sputtering titanium. Another conclusion is to use lower sputter pressures (less than the conventional 3–4 mTorr; in the general range os less than—1.0 mTorr), even if argon is used as the inert sputtering specie.

EXAMPLE

Having generally discussed various aspects of the invention, a specific Example will now be discussed with reference to filling the contact hole shown in FIG. 1. The diffusion region 20 and passivation layer 30 are defined and deposited using conventional techniques. Then a photoresist mask is defined on the passivation layer 30 to define the contact hole 50, and the contact hole is etched using reactive ion techniques in a ambient CF4+02. Note that the photoresist mask is fairly thicK, such that the image will still be in place at the end of the etch process.

Then 600 angstroms of titanium and 400 angstroms of TiN are sputter deposited through a 1:1 collimator, at 0.7–1.0 mTorr pressure. During the titanium deposition the substrate temperature is maintained at 450° C., and argon is used as the inert bombardment atom. During the TIN deposition, the ambient is changed to N2. The resulting composite film has portion 40C that is on the order of 260 angstroms (or roughly 25%) of the thickness of portions 40A. Moreover, the sidewall portions 40B of the composite film have substantially uniform thickness along the entire contact hole sidewall, enhancing adhesion of subsequently-applied films. As previously discussed, the resulting film presents low bulk resistivity, low contact resistance, low oxygen concentration, and enhanced surface morphology as compared to similar films deposited without collimation. Also, the collimated TiN provides an improved barrier to fluorine penetration of the underlying films at the bottom of the contact hole. Fluorine contamination of underlying titanium films and silicides is known to cause failure by a number of mechanisms including loss of adhesion of CVD tungsten and high contact resistance. For some applications, the fluorine barrier properties of the layers can be further enhanced by carrying out an anneal step at 500°–600° C. in a N2 ambient to complete the conversion of any remaining T1 sidewall components to Ti nitride.

It is to be understood that various modifications can be made to the structures and teachings discussed above without departing from the spirit and scope of the invention. For example, while the invention has been discussed with reference to titanium and titanium nitride, it can be utilized in conjunction with any other sputtered, reactively sputtered or evaporated barrier material such as chromium, tungsten and TiW, as well as with materials such as tungsten and aluminum that would be used to fill such high aspect ratio apertures. Moreover, while the invention has been illustrated with reference to a particular contact embodiment, it can be applied to a broad range of applications in which high aspect ratio apertures are to be coated or filled. Finally, the specific times, temperatures pressures, ambients, etc. discussed can be optimized for a given application.

What is claimed is:

1. In a process for sputtering a barrier layer metallurgy comprising a refractory metal or refractory metal alloy from a sputter target into contact holes having side and bottom surfaces defined in an insulator arranged on a semiconductor substrate, at least some of the contact holes having an aspect ratio on the order of 2:1, the improvement comprising disposing a collimator between said sputter target and the substrate, said collimator being spaced from the substrate, said collimator having at least some openings with an aspect ratio of at least 1:1, and sputtering said refractory metal or refractory metal alloy at a pressure between approximately 0.7 mTorr and 3 mTorr, said refractory metal or refractory metal alloy being formed on said side and bottom surfaces of said contact holes and having a substantially uniform thickness at said side surfaces of said contact holes.

2. The process as recited in claim 1, wherein said refractory metal is sputtered at a pressure of less than 1.0 mTorr.

3. The process as recited in claim 2, wherein said refractory metal comprises titanium.

4. The process as recited in claim 2, wherein said refractory metal alloy comprises titanium nitride.

5. The process as recited in claim 4, wherein said deposition is carried out in an N2 ambient.

6. In a sputtering process for depositing a refractory metal or refractory metal alloy layer from a sputter target onto a substrate having at least some depressions therein with aspect ratios on the order of 2:1, each of said depressions having bottom and side surfaces, the improvement comprising disposing a collimator between the sputter target and the substrate, said collimator being spaced from the substrate, and sputtering said refractory metal or refractory metal alloy layer at a pressure between approximately 0.7 mTorr and 3 mTorr and at a substrate temperature of approximately 150° C., said refractory metal or refractory metal alloy layer being formed on said side and bottom surfaces of said depressions and having a substantially uniform thickness at said side surfaces of said depressions.

7. A process for forming a Ti/TiN barrier layer within a 2:1 aspect ratio aperture formed within a passivation layer arranged on a substrate, comprising the steps of:
   sputtering a layer of titanium onto the substrate through a collimator having 1:1 aspect ratio openings therein, said collimator being spaced from the substrate, said layer of titanium being sputtered at a pressure between 0.7 mTorr and 3 mTorr;
   sputtering a layer of titanium nitride onto said layer of titanium through said collimator, said second sputtering step being carried out in a working gas consisting essentially of N2 and a pressure between 0.7 mTorr and 3 mTorr,
   said layers of titanium and titanium nitfide being formed on said sides and bottom of said aperture, and having a substantially uniform thickness on said sides of said aperture; and
   annealing said layers of titanium and titanium nitride in an $N_2$ ambient to convert titanium on said sides of said aperture to titanium nitride.

8. The process as recited in claim 7, wherein said pressure is not greater than approximately 1 mTorr.

9. A process for sputtering a layer of titanium nitride onto a substrate having at least one depression having side and bottom surfaces, said at least one depression having an aspect ratio on the order of 2:1, comprising the steps of forming said at least one depression on said substrate, and sputtering said layer of titanium nitfide onto the substrate through a collimator spaced from the substrate, said sputtering step being carded out at a pressure between approximately 0.7 mTorr and 3 mTorr, and in a working gas consisting essentially of $N_2$, said layer of titanium nitride being deposited on said side and bottom surfaces of said at least one depression, said layer of titanium nitride being deposited at a substantially uniform thickness on said side surfaces of said at least one depression.

10. The process as recited in claim 9, wherein said pressure is not greater than approximately 1 mTorr.

11. The process as recited in claim 10, wherein said substrate is heated to approximately 1500° C. during said sputtering step.

12. The process as recited in claim 6, wherein said sputtering process is carried out at a pressure of less than 1.0 mTorr.

* * * * *